United States Patent [19]
Lin et al.

[11] Patent Number: 5,870,341
[45] Date of Patent: Feb. 9, 1999

[54] MEMORY COLUMN REDUNDANCY CIRCUIT

[75] Inventors: Kuan-yu J. Lin, Mountain View; Song C. Kim, Santa Clara, both of Calif.

[73] Assignee: Sun Microsystems, Inc.

[21] Appl. No.: 878,755

[22] Filed: Jun. 19, 1997

[51] Int. Cl.$^6$ ...................................................... G11C 7/00
[52] U.S. Cl. .................................. 365/200; 365/230.02
[58] Field of Search .............................. 365/200, 230.02, 365/225.7

[56] References Cited

U.S. PATENT DOCUMENTS

| 5,506,807 | 4/1996 | Ferrant et al. | 365/200 |
| 5,535,161 | 7/1996 | Kato | 365/200 |

*Primary Examiner*—Vu A. Le
*Attorney, Agent, or Firm*—Conley, Rose & Tayon, PC; B. Noel Kivlin

[57] ABSTRACT

A memory circuit which steers read/write data to a memory array including a plurality of columns (at least one of which is redundant). Coupled to the bit line of each column are a normal mode write transistor and a redundant mode write transistor. If a failing column is detected during manufacturing testing of the memory array, a repair signal for each of the failing column and subsequent columns in the array are de-asserted. When a write operation is performed on the array, an input data bit is provided corresponding to each non-redundant column in the array. The input data bit written to a particular bit line, however, depends upon the state of the repair signal for that column. If the repair signal for a particular column is asserted, the input to the normal mode write transistor is conveyed as write data. Conversely, the input to the redundant mode write transistor is conveyed as write data if the repair signal is de-asserted for a particular column. Similar circuitry is also included to perform steering during a read operation. By proper assertion of the repair signal for each column, the memory circuit causes failing columns to be bypassed during operation of the memory array. The configuration of this memory circuit may advantageously increase the speed of the array for read/write operations. In addition, the loading on each bit line may be decreased, which advantageously decreases write recovery time for the array.

26 Claims, 5 Drawing Sheets

MEMORY COLUMN REDUNDANCY CIRCUIT

BACKGROUND OF THE INVENTION

1. Field of the Invention

This invention relates to the field of digital electronic memory devices, and in particular to a memory circuit for reading and writing a memory array including redundant columns.

2. Description of the Related Art

It is common practice for the manufacturers of memory chips to test the functionality of the memories at the manufacturing site. Before the memory chips are released for shipment, they typically undergo testing to verify that each of the memory cells within the memory array is functioning properly. This testing method is routinely performed because it is not uncommon for a percentage of the memory cells within the chip to fail, either because of manufacturing defects or degradation faults.

Because of this likelihood of failing cells, memory arrays are typically manufactured with redundant rows or columns. When failing rows or columns are detected during manufacturing testing, these locations may be permanently disabled and accesses to these cells are instead routed to cells of a redundant row or column. This procedure increases chip yields while maintaining high test coverage.

Turning now to FIG. 1, a block diagram of portions of a typical memory system including redundant columns is depicted. As shown, static RAM (SRAM) memory device 10 includes column n switch logic 20A, column (n+1) switch logic 20B, and sense amplifier 50. Column n switch logic 20A includes a bit line 22A coupled to a transmission gate 24A. Although not shown in FIG. 1 for simplicity, bit line 22A is also coupled to a column of SRAM memory cells within SRAM memory device 10. The n-channel transistor of transmission gate 24A is coupled to a column n repair signal 28A, while the p-channel transistor of transmission gate 24A is coupled to an inverted column n repair signal 28A. Transmission gate 24A is also coupled to a transmission gate 26A a bit line recover logic block 44A, a column n read transistor 40A, and a column n write transistor 42A. Inverted column n repair signal 28A is also coupled to the n-channel transistor of transmission gate 26A, while the p-channel transistor of transmission gate 26A is coupled to non-inverted column n repair signal 28A. Transmission gate 26A is additionally coupled to bit line 30A which is correspondingly coupled to a column (n+2) of memory cells within SRAM memory device 10.

Column n read transistor 40A is further coupled to sense amplifier 50 via a sense amplifier read input 38A, and receives an inverted version of column n read select signal 32A as a selection signal. Column n write transistor 42A receives a write data bit n 36A as input, and column n write select signal 34A for selection control.

Column (n+1) switch logic 20B is configured similarly to column n switch logic 20A. Column (n+1) switch logic 20B includes a bit line 22B, a transmission gate 24B, a transmission gate 26B, a column (n+1) repair signal 28B, a bit line recover logic block 44B, a column (n+1) read select signal 32B, a column (n+1) write select signal 34B, a column (n+1) read transistor 40B, a column (n+1) write transistor 42B, a write data bit (n+1) 36B, and a sense amplifier read input 38B.

Although not shown in FIG. 1, column n switch logic 20A and column (n+1) switch logic 20B each include a bit line complement signal (with associated transmission gates and read/write transistors). During read and write operations, this bit line carries the complement of the value conveyed on the regular bit line.

Column n switch logic 20A is configured to route read and write data as specified by column n repair signal 28A. For a read operation, column n read select signal 32A is asserted, causing column n read transistor 40A to be activated. A bit value will then be conveyed to sense amplifier 50 from either bit line 22A or bit line 30A, depending on the state of column n repair signal 28A. If column n repair signal 28A is active, the bit value on bit line 22A is conveyed to sense amplifier read input 38A. If column n repair signal 28A is inactive, the bit value on bit line 30A is conveyed to sense amplifier read input 38A.

The assertion of column n repair signal 28A indicates that no failing columns have been detected prior to and including column n within SRAM memory device 10. The read value conveyed to sense amplifier read input 38A thus corresponds to the bit line 22A of column n. The terms "prior to" and "subsequent to" are used herein to refer to relative column positions within a memory array. A first column is prior to a second column if the first column receives a more significant bit than the second column during a write operation (assuming an initial column in the array receives the most significant bit in a write operation). Accordingly, a first column is subsequent to a second column if the second column receives a more significant bit during a write operation. If column n repair signal 28A is de-asserted, this indicates that either column n has failed or that a column prior to column n has failed. The read value conveyed to sense amplifier read input 38A is thus conveyed from a bit line from a subsequent column (e.g., bit line 30A from column (n+2)).

A write operation proceeds similarly. In column switch logic 20A, column n write select signal 34A activates column n write transistor 42A, driving write data bit n 36A to one of two bit lines. Write data bit n 36A is conveyed to bit line 22A through transmission gate 24A if column n repair signal 28A is asserted, and is conveyed to bit line 30A through transmission gate 26A if column n repair signal 28A is de-asserted. If column n repair signal 28A is de-asserted, a data bit (n−2) may be routed to bit line 22A through a transmission gate not shown in FIG. 1.

Thus, to perform a read operation, the read data (from bit line 22A or 22B) passes through transmission gate 24A and column n read transistor 40A. Similarly, to write data to bit line 22A, write data bit m 36A passes through both column n write transistor 42A and transmission gate 24A. The speed of SRAM device 10 for read/write operations is thus limited by this transmission gate/transistor path.

As described above, each column in SRAM device 10 includes both a bit line and a bit line complement signal. During a write operation, one of these signals is driven to a logic low level. Before a subsequent access takes place, each of these signals is precharged to a logic high voltage by bit line recover logic 44. This precharge time, or "write recovery time", increases as the loading on the bit lines increases. Increased write recovery time results in more idle time between successive write operations, and slower overall operation of SRAM device 10.

A memory circuit is therefore desirable which may attain increased read/write speed and reduced loading upon each of the bit lines.

SUMMARY OF THE INVENTION

The problems outlined above are in large part solved by a memory circuit in accordance with the present invention.

In one embodiment, a memory circuit is provided which steers read/write data to a memory array including a plurality of columns (at least one of which is redundant). Coupled to the bit line of each column are a normal mode write transistor, a redundant mode write transistor, and a normal mode read transistor, which is also coupled to a corresponding sense amplifier read input. A redundant mode read transistor is additionally coupled to the sense amplifier read input and the normal mode read transistor. If a failing column is detected during manufacturing testing of the memory array, the repair signals for the failing column and subsequent columns in the array are de-asserted. When a write operation is performed on the array, an input data bit is provided corresponding to each non-redundant column in the array. The input data bit written to a particular bit line, however, depends upon the state of the repair signal for that column. If the repair signal for a particular column is asserted, the input to the normal mode write transistor is conveyed as write data. Conversely, the input to the redundant mode write transistor is conveyed as write data if the repair signal is de-asserted for a particular column. When a read operation is performed on the array, a read data value is conveyed from each non-bypassed column (redundant or non-redundant) in the array to a sense amplifier read input. The read data value conveyed to a particular sense amplifier read input, however, depends upon the state of the repair signal for that column. If the repair signal for a particular column is asserted, the sense amplifier receives a read data value from the corresponding bit line of the same column through the normal mode read transistor. If, however, the repair signal for a particular column is de-asserted, the sense amplifier receives a read data value from a bit line corresponding to a different column through the redundant mode read transistor. By proper assertion of the repair signal for each column, the memory circuit causes failing columns to be bypassed during operation of the memory array. The configuration of this memory circuit may advantageously increase the speed of the array for read/write operations. In addition, the loading on each bit line may be decreased, which advantageously decreases write recovery time for the array.

Broadly speaking, the present invention contemplates a memory device, comprising a memory array including a plurality of columns with at least one redundant column. Each of the plurality of columns includes a plurality of memory cells, and the plurality of columns includes a first column and a second column. The memory device further includes a sense amplifier including a first input corresponding to the first column. Additionally, the memory device includes a normal mode read transistor coupled to the first input and a first bit line, which is coupled to the first column. Furthermore, the memory device includes a redundant mode read transistor coupled to the first input and a second bit line, which is coupled to the second column. Finally, the memory device includes a control unit coupled to the normal mode read transistor and the redundant mode read transistor, wherein the control unit is configured to activate the redundant mode read transistor and de-activate the normal mode read transistor in response to a failing column being detected, thereby conveying a value from the second bit line to the first input.

The present invention further contemplates a memory device comprising a memory array including a plurality of columns including at least one redundant column. Each of the plurality of columns includes a plurality of memory cells, and the plurality of columns includes a first column and a second column. The memory device also includes a normal mode write transistor coupled to a first write input bit and a first bit line, which is coupled to the first column. Furthermore, the memory device includes a redundant mode write transistor coupled to the first bit line and a second write input bit. Finally, the memory device includes a control unit coupled to the normal mode write transistor and the redundant mode write transistor, wherein the control unit is configured to activate the redundant mode write transistor and de-activate said normal mode write transistor in response to a failing column being detected, thereby conveying a value of said second write input bit upon said first bit line.

Still further, the present invention contemplates a memory device comprising a memory array including a first column of memory cells and a redundant column of memory cells. The memory device further includes a sense amplifier for conveying a read value to be read from the memory array. Additionally, the memory device includes a normal mode read transistor coupled to selectively convey a stored value associated with the first column of memory cells to the sense amplifier in response to a read operation when a redundancy mode is disabled, and a redundant mode read transistor coupled to selectively convey a second stored value associated with the redundant column of memory cells to the sense amplifier in response to the read operation when the redundancy mode is enabled.

Finally, the present invention contemplates a memory device comprising a memory array including a first column of memory cells and a redundant column of memory cells. The memory device includes a normal mode write transistor coupled to selectively convey a write value associated with the first column of memory cells to the first column of memory cells in response to a write operation when a redundancy mode is disabled. The memory device additionally includes a redundant mode write transistor coupled to selectively convey the write value to redundant column of memory cells in response to the write operation when said redundancy mode is enabled.

BRIEF DESCRIPTION OF THE DRAWINGS

Other objects and advantages of the invention will become apparent upon reading the following detailed description and upon reference to the accompanying drawings in which.

Figure 1:
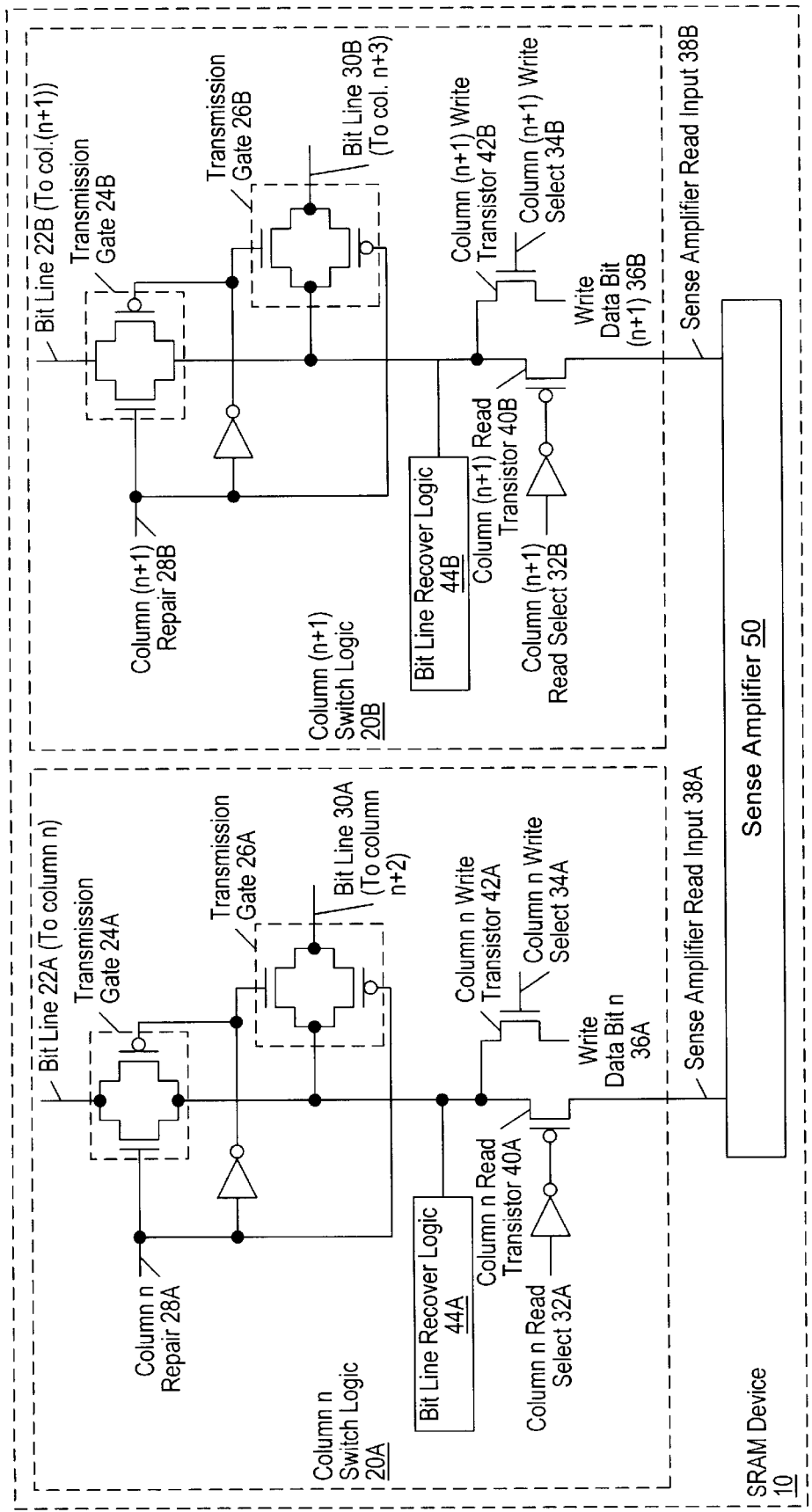
FIG. 1 depicts a block diagram of portions of a memory system including redundant columns.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
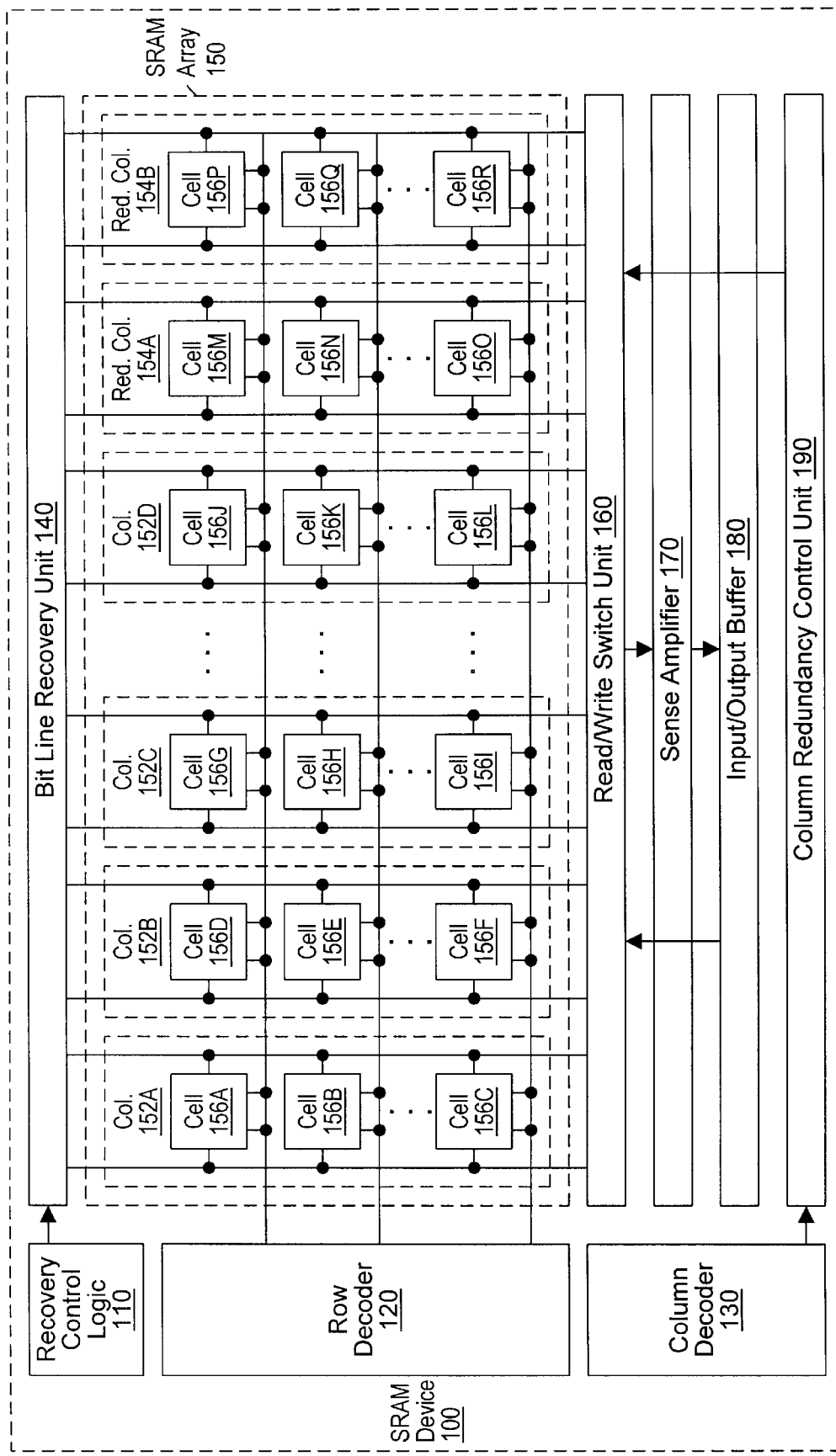
FIG. 2 depicts a high-level block diagram of one embodiment of a memory device including redundant columns.

Turning now to FIG. 2, a block diagram of one embodiment of an SRAM device 100 is depicted. SRAM device 100 includes a recovery control logic unit 110, a row decoder 120, a column decoder 130, a bit line recovery unit 140, an SRAM array 150, a read/write switch unit 160, a sense amplifier 170, an input/output buffer 180, and a column redundancy control unit 190. Recovery control logic unit 110 is coupled to bit line recovery unit 140, which, in turn, is coupled to SRAM array 150. Row decoder 120 is further coupled to SRAM array 150. SRAM array 150 includes columns 152A–D and redundant columns 154A–B. Each column (152 or 154) includes a plurality of cells 156. Column 152A includes cells 156A–C; column 152B includes cells 156D–F, etc. Each cell 156 in SRAM array 150 is configured to store a single data bit. Row decoder 120 is coupled to SRAM array 150 via word lines connected to each cell in a particular row.

Read/write switch unit 160 is coupled to SRAM array 150, sense amplifier 170, input/output buffer 180, and column redundancy control unit 190. Sense amplifier 170 is further coupled to input/output buffer 180, which is further coupled to external pins of SRAM device 100 not shown in FIG. 2 for simplicity. Column decoder 130 is coupled to column redundancy control unit 190, which is also coupled to read/write switch unit 160.

During manufacturing of SRAM device 100, various tests are conducted to insure proper functionality of each cell 156 in SRAM array 150. A repair signal within column redundancy control unit 190 is then set for each column 152. This repair signal is employed to generate routing information to read/write switch unit 160, and may be configured in one embodiment by either blowing or not blowing a fuse associated with each column.

Data is written to SRAM array 150 by providing write input data to input/output buffer 180 and selecting a particular row of cells 156 by providing a row address to row decoder 120. For each column 152, read/write switch unit 160 conveys a corresponding data bit and its complement on separate bit lines. The cell 156 in each column that is located in the row activated by row decoder 120 will store the corresponding data bit. Unlike a dynamic memory cell, the value remains stored in each cell 156 until another write takes place. After a write is performed, no subsequent accesses to SRAM array 150 may be performed until the bit lines (both the "regular" bit line and its complement) coupled to each column 152 are precharged to a logic high level.

Data is read from SRAM array 150 by selecting a particular row of cells 156 by providing a row address to row decoder 120. At the beginning of the read operation, the bit lines coupled to each column 152 are in a logic high state. When the read occurs, each cell 156 in the selected row conveys the stored value in the cell and the complement of the stored value on separate bit lines coupled to each column. Sense amplifier 170 detects either a charging or discharging of the bit lines for each column, and conveys a logic high or low value to input/output buffer 180 accordingly.

In one embodiment, sense amplifier 170 has a number of inputs equal to the number of columns 152 in SRAM array 150. During a read operation, the read value may be provided from one of two columns for each input of sense amplifier 170 according to select signals provided by column redundancy control unit 190. For each column 152 for which column redundancy control unit 190 provides an asserted normal read select signal, the read value for a particular sense amplifier 170 input will be conveyed from the bit line of the corresponding column. For each column 152 for which column redundancy control unit 190 provides an asserted redundant read select signal, the read value for a particular sense amplifier 170 input will be conveyed from a bit line of a different column.

As will be described below, the logic within read/write switch unit 160 is configured to reduce the propagation delay on the bit lines coupled to each column 152 in SRAM array 150. This configuration increases the read/write speed of SRAM device 100. Additionally, the loading on each bit line is reduced, thus advantageously decreasing write recovery time.

Figure 3:
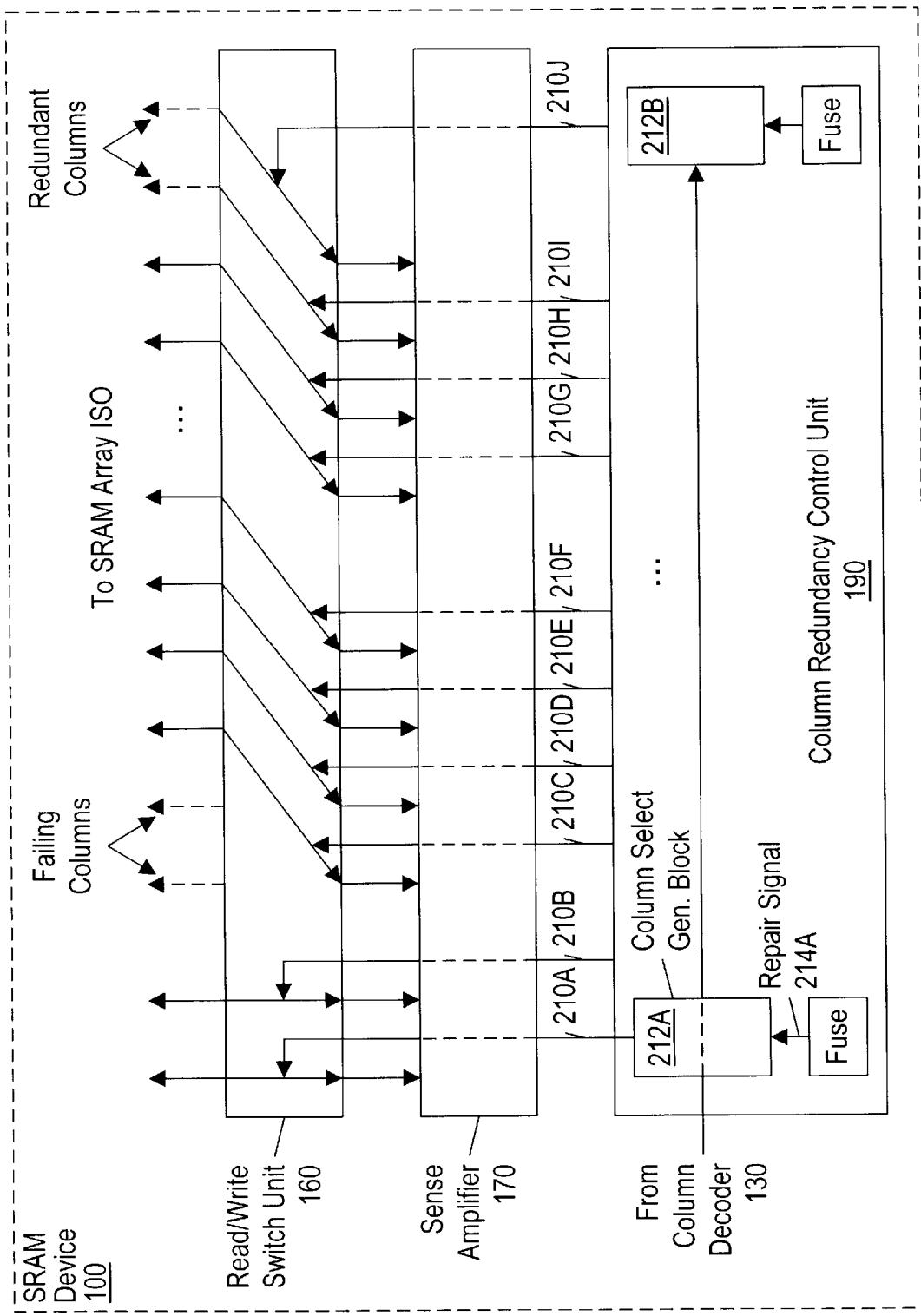
FIG. 3 depicts a block diagram depicting operation of one embodiment of the switching functionality within SRAM device 100.

Turning now to FIG. 3, a block diagram depicting operation of one embodiment of the switching functionality of SRAM device 100 is shown. Logic blocks corresponding to those of FIG. 2 are numbered identically for simplicity and clarity. For purposes of explanation, only the read operation is illustrated in FIG. 3.

Read/write switch unit 160 is coupled to SRAM array 150 via a plurality of bit lines. As depicted, SRAM array 150 includes both failing columns and redundant columns. Each read input to sense amplifier 170 is connected to a non-failing bit line in SRAM array 150 via read/write switch unit 160. The input of each switch circuit in read/write switch unit 160 is determined in response to a corresponding plurality of select signals 210 provided for each column by column redundancy control unit 190. Each of select signals 210 is generated by a corresponding column select generation block 212, which receives column read/write signals from column decoder 130 and a corresponding repair signal 214 from a fuse circuit.

As described above, each cell 156 in SRAM array 150 is tested during manufacturing to insure correct functionality. When a failing column is detected during testing, repair signals 214 for the failing and subsequent columns in the array are de-asserted by blowing a coupled fuse. (For those columns which the fuse is not blown, the corresponding repair signal 214 is asserted). During subsequent operation of SRAM device 100, repair signals 214 are permanently configured for proper steering of data.

In another embodiment, a number of fuses may be employed to form a binary encoded representation of the first failing column number. Each column includes combinatorial logic which asserts repair signal 214 if its column number is less than the column number indicated by the binary encoded fuses. Conversely, the combinatorial logic for each column de-asserts repair signal 214 if its column number is equal to or greater than the column number indicated by the fuses. A variety of other mechanisms are possible for generating appropriate signals for disabling failed columns and enabling redundant columns.

For each column 152 in SRAM array 150, corresponding repair signal 214 is employed to generate a pair of read select signals, shown collectively as select signals 210 in FIG. 3. When active, the first of these read select signals causes a sense amplifier 170 input to be connected to the bit line of the corresponding column. This first signal is referred to as the normal read select signal. As illustrated in FIG. 3, the switches in read/write switch unit 160 that are prior to the failing columns in SRAM array 150 are controlled by the normal read select signal. The second of these read select signals, when active, causes a corresponding sense amplifier 170 input to be connected to a bit line of a column subsequent to the one that is connected when the normal read select signal is active. In one embodiment, the subsequent column is a fixed number of columns from the column selected by the normal read select. This second signal is referred to as the redundant read select signal. As illustrated in FIG. 3, the switches in read/write switch unit 160 subsequent to the failing columns are controlled by the redundant read select signal.

In the column redundancy method employed here, data values are thus not read or written to columns determined to be faulty during manufacturing testing. If there are no failing columns in SRAM array 150, the repair signal for each column is asserted. During a read operation, the normal read select signal is active for each column. Each sense amplifier 170 thus receives read data from the bit line of the same column. On the other hand, if a defective column is found, the repair signals for the failing column and subsequent columns are de-asserted. During a read operation, the normal read select signal is active for each column prior to the failing column, while the redundant read select signal is active for the failing column and subsequent columns. Select signals 210 also include two write select signals, and a similar steering procedure is employed for write operations.

Figure 4:
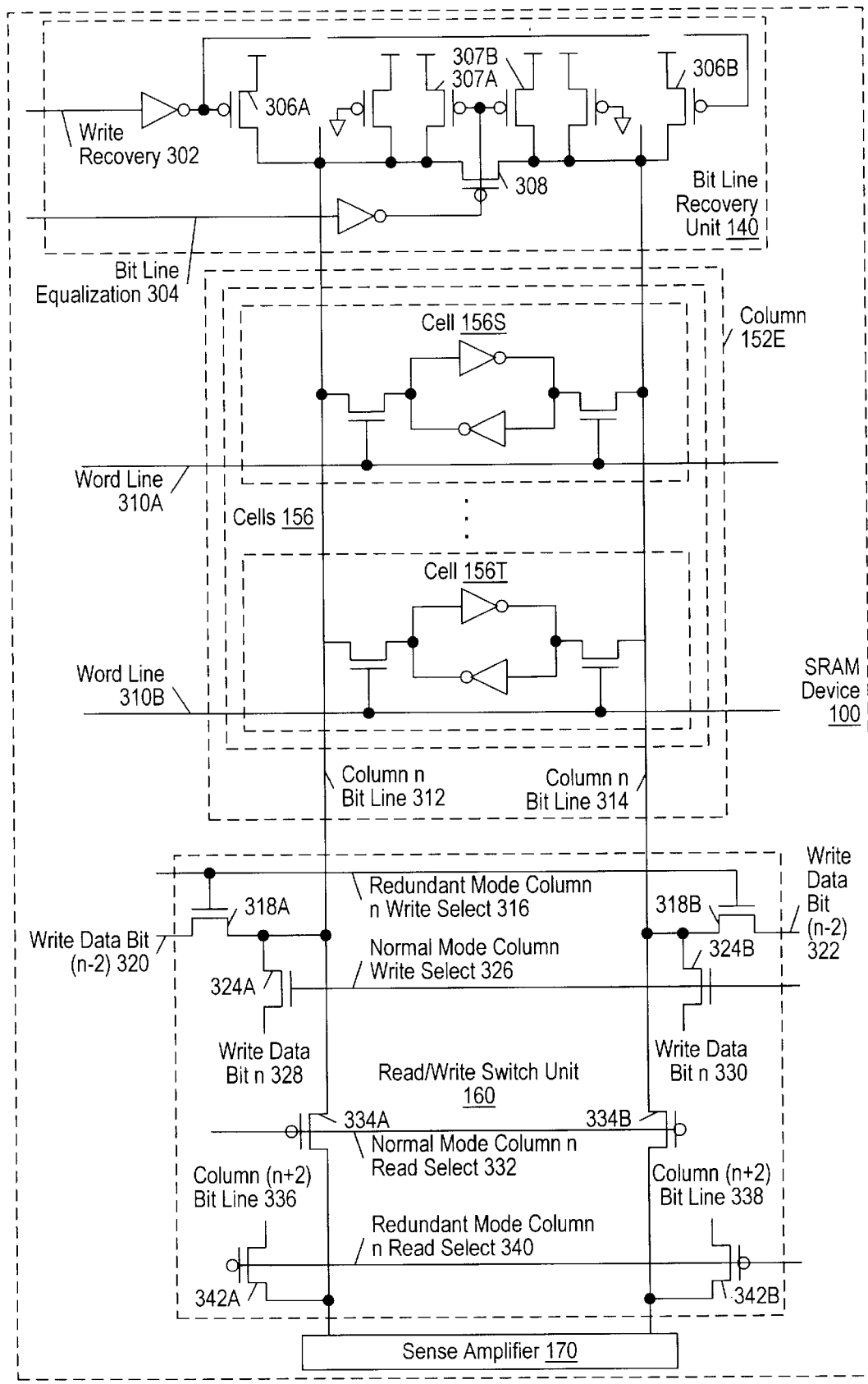
FIG. 4 depicts a block diagram of one embodiment of a memory column within SRAM device 100.

Turning now to FIG. 4, a block diagram of one implementation of a column within SRAM device 100 is depicted. Logic blocks corresponding to those in FIG. 2 are numbered identically for simplicity and clarity.

SRAM device 100 includes bit line recovery unit 140, column 152E (which is generally representative of columns 152A–D shown in FIG. 2), read/write switch unit 160, and sense amplifier 170. Bit line recovery unit 140 includes write recovery transistors 306A–B coupled to a column n bit line 312 and a column n bit line' 314, respectively. Write recovery transistors 306A–B are turned on and off by a write recovery signal 302 conveyed from recovery control logic unit 110 through an inverter. When activated, write recovery transistors 306A–B charge bit lines 312 and 314 to a logic high level. Furthermore, bit line recovery unit 140 includes an equalization transistor 308 which, when activated by a bit line equalization signal 304 (also conveyed from recovery control logic unit 110) through an inverter, couples column n bit line 312 and column n bit line' 314. Additional pullup transistors are also activated by bit line equalization signal 304.

Column 152E includes cells 156S–T (which are generally representative of each of the cells 156A–R shown in FIG. 2). As illustrated, each cell 156 includes two access transistors coupled to one of word lines 310A–B, which are conveyed by row decoder 120. Two cross-coupled inverters connect the access transistors of each cell.

Read/write switch unit 160 includes redundant mode write transistors 318A–B, normal mode write transistors 324A–B, normal mode read transistors 334A–B, and redundant mode read transistors 342A–B. Redundant mode write transistor 318A receives a write data bit (n−2) 320 as input, conveys output on column n bit line 312, and is turned on and off by redundant mode column n write select signal 316. Redundant mode write transistor 318B is also controlled by redundant mode column n write select 316. Furthermore, redundant mode write transistor 318B receives the complement of write data bit (n−2) 320, write data bit (n−2)' 322, as input, and conveys output on column n bit line' 314 when active. Normal mode write transistor 324A receives input on write data bit n 328, conveys output on column n bit line 312, and is controlled by normal mode column n write select signal 326, which also controls normal mode write transistor 324B. Normal mode write transistor 324B receives the complement of write data bit n 328, write data bit n' 330, as input, and conveys output on column n bit line' 314.

Normal mode read transistor 334A receives input from column n bit line 312, conveys output to sense amplifier 170, and is controlled by normal mode column n read select 332, which also controls normal mode read transistor 334B. Normal mode read transistor 334B receives the complement of column n bit line 312, column n bit line' 314, as input, and conveys output to sense amplifier 170. Redundant mode read transistor 342A receives column (n+2) bit line 336 as input, conveys output to sense amplifier 170, and is controlled by redundant mode column n select signal 340, which also controls redundant mode read transistor 342B. Redundant mode read transistor 342B receives the complement of column (n+2) bit line 336, column (n+2) bit line' 338, as input, and conveys output to sense amplifier 170.

To write data to an SRAM cell such as one of the cells 156S–T shown in FIG. 4, the write data value and its complement are conveyed on column n bit line 312 and column n bit line' 314, respectively. The functionality of the switching transistors involved in this operation is discussed below. Concurrently with the data value and complement being conveyed on bit lines coupled to column 152, a given word line 310 is asserted in response to a corresponding row address being presented to row decoder 120. An active word line 310 turns on the access transistors of cell 156, thereby conveying the write data value and complement to the inputs of the cross-coupled inverters. The data value conveyed on column n bit line 312 thus becomes stored in cell 156 when word line 310 is de-asserted. Unlike a dynamic memory cell, the value written in cell 156 remains stored until overwritten with a subsequent value or the power supply is interrupted.

After the write operation is performed, write recovery signal 302 and bit line equalization signal 304 are asserted. Assertion of write recovery signal 302 causes write recovery transistors 306A–B to turn on, precharging column n bit line 312 and column n bit line' 314. Assertion of bit line equalization signal 304 activates equalization transistor 308, coupling column n bit line 312 to column n bit line' 314. (Sense amplifier 170 may not function correctly in a subsequent read cycle if the bit lines are not charged to precisely the same value). During a write operation, one of the bit lines 312 or 314 coupled to column 152 is driven to a logic low level, while the other remains driven at a logic high level. To prepare for the next write cycle, both bit lines 312 and 314 are precharged to a logic high level. The length of precharge time is known as write recovery time. In order to quickly drive one of bit lines 312/314 back to a logic high level, write recovery transistors 306 are appropriately sized. The write recovery time is a function of the capacitive loading on bit lines 312 and 314. As will be described below, the memory circuit for each bit line in read/write switch unit 160 advantageously decreases loading on bit lines 312 and 314, thus decreasing write recovery time.

To read data from an SRAM cell such as one of the cells 156 shown in FIG. 4, a word line 310 is asserted in response to a row address presented to row decoder 120. Each cell 156 in the row with the asserted word line 310 conveys the value stored in the cell on the coupled bit line, and conveys the complement of the value stored in the cell on the coupled complement bit line. For example, when word line 310A is asserted, cell 156S asserts the value stored in its cell on column n bit line 312 and the complement of the stored value on column n bit line' 314. The value/complement are routed through switching logic (described below) to two inputs of sense amplifier 170. Sense amplifier 170 detects a voltage drop in one of the two bit lines, and conveys a read value to input/output buffer 180 accordingly. For example, upon a read operation to cell 156S, if column n bit line' 314 discharges (and column n bit line 312 remains charged), sense amplifier 170 interprets the read value as a logic high. In one embodiment, sense amplifier 170 detects this voltage drop relatively quickly, so that the discharging bit line does not have to discharge all the way to the logic low level in order for a logic low value to be read from the array.

As with the write operation, bit lines for each column 152 in SRAM array 150 are precharged after performing the read operation. Because the bit lines are not driven all the way to the logic low supply voltage during a read, the write recovery transistors are not employed in one embodiment. Instead, relatively small pullup transistors 307A–B precharge the bit lines. Bit line equalization signal 304 is asserted in both read and write cycles to insure both bit lines are charged to precisely the same logic high voltage.

When a write operation is performed to SRAM array 150 complement are provided by input/output buffer 180 for each non-redundant column 152. The write input value corresponding to column 152E (column n) is write data bit n 328, and the complement of the write input value is write data bit n' 330. These values are the inputs to normal mode write transistors 324A and 324B, respectively. These values are conveyed upon column n bit line 312 and column n bit line' 314 in response to normal mode column n write select 326 being asserted by column redundancy control unit 190. Normal mode column n write select 326 is asserted during a write operation for each column for which there are no prior failing columns in SRAM array 150.

For columns for which there are prior failing columns in SRAM array 150, however, column redundancy decoder 190 asserts redundant mode column n write select 316 during a write operation. Redundant mode column n write select 316, when asserted, activates redundant mode write transistors 318A–B. Redundant mode write transistors 318A and 318B receive write data bit (n−2) 320 and its complement, write data bit (n−2)' 330, as inputs, respectively.

When a read operation is performed from SRAM array 150, a read input value and complement are provided by each column (redundant and non-redundant). A number of read input values equal to the number of read inputs of sense amplifier 170 are selected in response to read select signals provided by column redundancy control unit 190. Sense amplifier 170 has a read input (including an input for both the read value and its complement) corresponding to each of non-redundant columns 152. A given sense amplifier 170 read input receives the read value from its corresponding column when normal mode column n read select signal 332 is asserted, activating normal mode read transistors 334A–B. Normal mode column n read select signal 332 is asserted for columns for which no prior columns are failing.

For columns for which there are prior failing columns in SRAM array 150, however, column redundancy decoder 190 asserts redundant mode column n read select 340 during a read operation. Redundant mode column n read select 340, when asserted, activates redundant mode read transistors 342A–B. Redundant mode read transistors 342A and 342B receive column (n+2) bit line 336 and its complement, column (n+2) bit line' 338, as inputs, respectively.

By employing normal and redundant mode transistors for both read and write operations, the speed of SRAM device 100 may be increased. For the read operation (either from a corresponding or alternate column), the read input data propagates through a single transistor from the bit line. Similarly, write input data is conveyed through a single transistor to the bit line. Accordingly, the read/write speed of SRAM device 100 may be increased with respect to the memory circuit shown in FIG. 1. The loading of the bit line may also be reduced in FIG. 4. While the memory circuit of FIG. 1 employs six transistors (two transmission gates, a read transistor, and a write transistor) coupled to each of the bit lines for read/write and switching functionality, the memory circuit in FIG. 4, employs four transistors (two read transistors and two write transistors) for the same purpose. The memory circuit in FIG. 4 may thus reduce loading, and hence decrease write recovery time.

Figure 5:
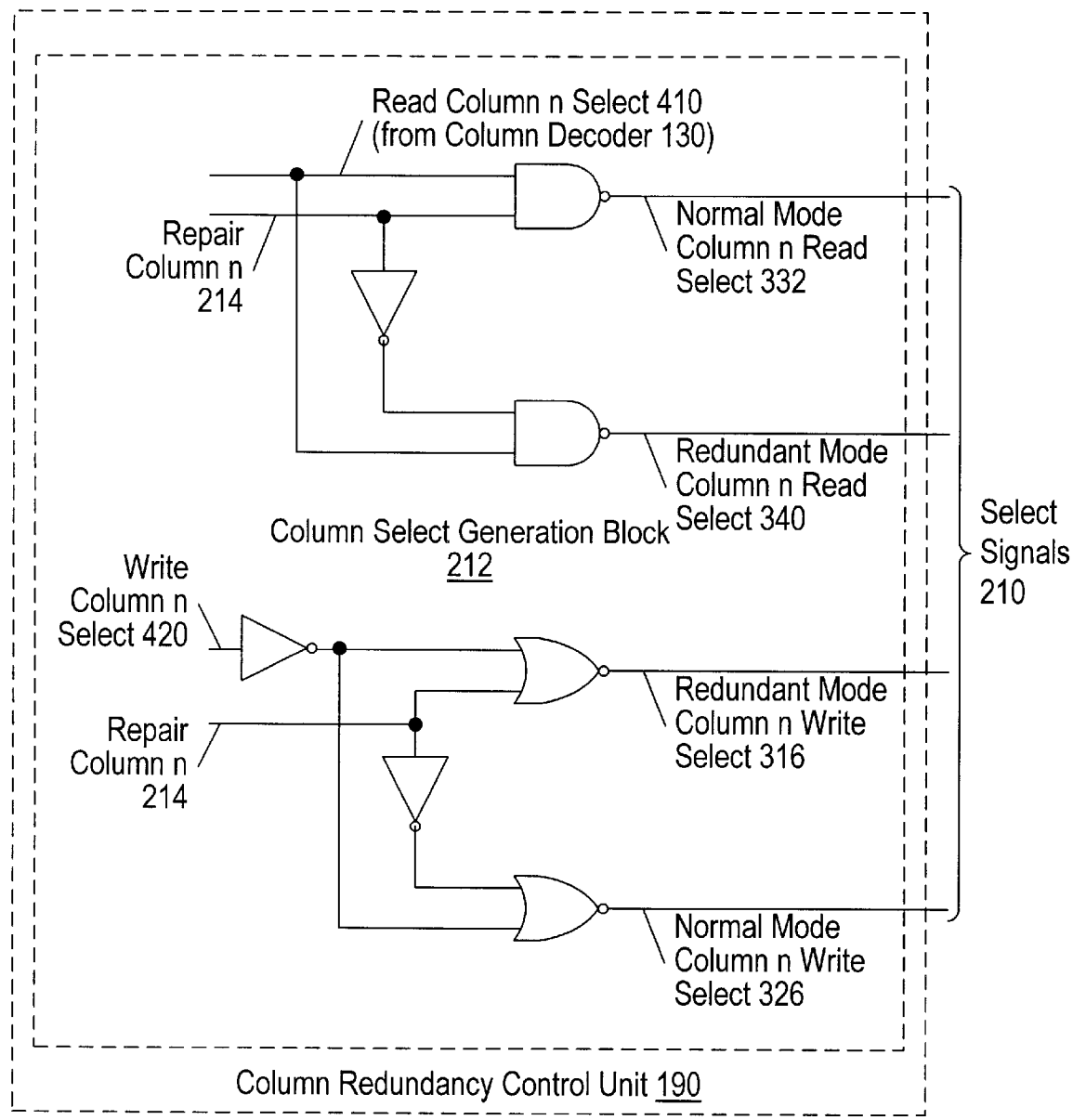
FIG. 5 depicts a block diagram of one embodiment of the combinatorial logic employed to generate normal and redundant column selects for a column within SRAM device 100.

Turning finally to FIG. 5, portions of one implementation of column redundancy control unit 190 are shown. In this implementation, column redundancy control unit 190 includes column select generation block 212, which generates read and write selects for a column n. Column select generation block 212 receives a read column n select signal 410 and a write column n select signal 420 from column decoder 130, and repair column n signal 214. Column select generation block 212 includes combinatorial logic which generates normal mode column n read select 332, redundant mode column n read select 340, redundant mode column n write select 316, and normal mode column n write select 326 (referred to collectively as select signals 210).

As shown in FIG. 4, normal mode column n read select 332 provides control for normal mode read transistors 334A–B, which are, in one embodiment, p-channel transistors (and thus active low). Redundant mode read transistors 342A–B, controlled by redundant mode column n read select 340, are also p-channel transistors in one embodiment. As can be seen from the combinatorial logic in column select generation block 212, normal mode column n read select 332 is active (low) when read column n select 410 is active (high) and repair column n signal 214 is also active (high). Similarly, redundant mode column n read select 340 is active (low) when read column n select 410 is active (high) and repair column n signal 214 is de-asserted (low).

Furthermore, normal column n write select 326 provides control for normal mode write transistors 324A–B, which are, in one embodiment, n-channel transistors (and thus active high). Redundant mode write transistors 318A–B, controlled by redundant mode column n write select 316, are also n-channel transistors in one embodiment. As shown in the combinatorial logic in column select generation block 212, normal mode column n write select 326 is active (high) when write column n select 420 is active (high) and repair signal 214 is asserted (high). Similarly, redundant mode column n write select 316 is active (high) when write column n select 420 is active (high) and repair column n signal 214 is de-asserted (low).

Numerous variations and modifications will become apparent to those skilled in the art once the above disclosure is fully appreciated. It is intended that the following claims be interpreted to embrace all such variations and modifications.

What is claimed is:

1. A memory device, comprising:
   a memory array including a plurality of columns each having a plurality of memory cells, wherein said plurality of columns includes a first column of memory cells coupled to a first bit line and a second column of memory cells coupled to a second bit line;
   a sense amplifier including a first read input for receiving a first read input value;

a normal mode read transistor coupled to said first read input and said first bit line;

a redundant mode read transistor coupled to said first read input and said second bit line;

a control unit coupled to said normal mode read transistor and said redundant mode read transistor;

wherein said control unit is further coupled to receive an indication that a redundancy mode is enabled for said first read input of said sense amplifier;

and wherein said control unit is configured to activate said redundant mode read transistor and de-activate said normal mode read transistor in response to receiving said indication, thereby conveying said first read input value to said first read input from said second bit line;

and wherein, when said redundancy mode is enabled for said first read input, said first read input value is conveyed from said second bit line to said first read input through a single switching element, wherein said single switching element is said redundant mode read transistor.

2. The memory device as recited in claim 1 wherein said memory array includes an initial column coupled to convey a most significant bit of a multi-bit read value to said sense amplifier, wherein said multi-bit read value includes said first read value.

3. The memory device as recited in claim 2, wherein said control unit is configured to disable said redundancy mode for said first read input in response to determining that a number of said plurality of columns are operating correctly.

4. The memory device as recited in claim 3 wherein said number of said plurality of columns which are determined to be operating correctly include said initial column, said first column, and any columns between said initial column and said first column.

5. The memory device as recited in claim 4 wherein said control unit disabling said redundancy mode for said first read input includes activating said normal mode read transistor and de-activating said redundant mode read transistor.

6. The memory device as recited in claim 2 wherein said control unit is configured to enable said redundancy mode for said first read input in response to a failing column being detected within said memory array.

7. The memory device as recited in claim 6 wherein wherein said failing column is said initial column, said first column, or a column located between said initial column and said first column.

8. A memory device, comprising:

a memory array including a plurality of columns each having a plurality of memory cells, wherein said plurality of columns includes a first column of memory cells coupled to a first bit line;

a normal mode write transistor coupled to receive a first write value, wherein said normal mode write transistor is further coupled to said first bit line;

a redundant mode write transistor coupled to receive a second write value, wherein said normal mode write transistor is further coupled to said first bit line;

a control unit coupled to said normal mode write transistor and said redundant mode write transistor;

wherein said control unit is further coupled to receive an indication that a redundancy mode is enabled for said first bit line;

and wherein said control unit is configured to activate said redundant mode write transistor and de-activate said normal mode write transistor in response to receiving said indication, thereby conveying said second write value to said first bit line;

and wherein, when said redundancy mode is enabled for said first bit line, said second write value is conveyed to said first bit line through a single switching element, wherein said single switching element is said redundant mode write transistor.

9. The memory device as recited in claim 8 wherein said memory array includes an initial column coupled to receive a most significant bit of a multi-bit write value, wherein said multi-bit write value includes said first write value and said second write value.

10. The memory device as recited in claim 9 wherein said control unit is configured to disable said redundancy mode for said first bit line in response to determining that a number of said plurality of columns are operating correctly.

11. The memory device as recited in claim 10 wherein said number of said plurality of columns which are determined to be operating correctly include said initial column, said first column, and any columns between said initial column and said first column.

12. The memory device as recited in claim 11 wherein said control unit disabling said redundancy mode for said first bit line includes activating said normal mode write transistor and de-activating said redundant mode write transistor.

13. The memory device as recited in claim 9 wherein said control unit is configured to enable said redundancy mode for said first bit line in response to a failing column being detected within said memory array.

14. The memory device as recited in claim 13 wherein said failing column is said initial column, said first column, or a column located between said initial column and said first column.

15. A memory device, comprising:

a memory array including a first column of memory cells and a redundant column of memory cells;

a sense amplifier for receiving a first read value from said memory array;

a normal mode read transistor configured to convey a first stored value associated with said first column of memory cells to said sense amplifier whenever a read operation is performed with a redundancy mode disabled for said first read value;

a redundant mode read transistor configured to convey a second stored value associated with said redundant column of memory cells to said sense amplifier whenever said read operation is performed with said redundancy mode enabled for said first read value;

and wherein, during enabling of said redundancy mode for said first read value, said first read value is conveyed to said sense amplifier from said redundant column of memory cells through a single switching element, wherein said single switching element is said redundant mode read transistor.

16. The memory device as recited in claim 15 wherein said redundancy mode is enabled for said first read value in response to determining said first of column of memory cells to be malfunctioning.

17. The memory device as recited in claim 16 wherein said redundancy mode is disabled for said first read value in response to determining said first column of memory cells to be operating correctly.

18. The memory device as recited in claim 17 wherein said redundancy mode is enabled for said first read value by blowing a fuse corresponding to said first column of memory cells, thereby asserting a repair signal coupled to said fuse.

19. The memory device as recited in claim 18 further comprising a control unit coupled to receive said repair signal.

20. The memory device as recited in claim 18 further comprising a control unit configured to activate said redundant mode read transistor and de-activate said normal mode read transistor in response to said repair signal being asserted.

21. A memory device, comprising:

a memory array including a first column of memory cells a normal mode write transistor configured to convey a first write value to said first column of memory cells whenever a write operation is performed with a redundancy mode disabled for said first column of memory cells;

a redundant mode write transistor configured to convey a second write value to said first column of memory cells whenever said write operation is performed with said redundancy mode enabled for said first column of memory cells;

and wherein, during enabling of said redundancy mode for said first column of memory cells, said second write value is conveyed to said first column of memory cells through a single switching element, wherein said single switching element is said redundant mode write transistor.

22. The memory device as recited in claim 21 wherein said redundancy mode is enabled for said first column of memory cells in response to determining said first of column of memory cells to be malfunctioning.

23. The memory device as recited in claim 22 wherein said redundancy mode is disabled for said first column of memory cells in response to determining said first column of memory cells to be operating correctly.

24. The memory device as recited in claim 23 wherein said redundancy mode is enabled for said first column of memory cells by blowing a fuse corresponding to said first column of memory cells, thereby asserting a repair signal coupled to said fuse.

25. The memory device as recited in claim 24 further comprising a control unit coupled to receive said repair signal.

26. The memory device as recited in claim 24 further comprising a control unit configured to activate said redundant mode write transistor and de-activate said normal mode write transistor in response to said repair signal being asserted.

* * * * *